(12) United States Patent
Butzmann

(10) Patent No.: US 6,828,781 B1
(45) Date of Patent: Dec. 7, 2004

(54) SENSOR ARRAY

(75) Inventor: Stefan Butzmann, Hagen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/612,580

(22) Filed: Jul. 2, 2003

(30) Foreign Application Priority Data

Jul. 6, 2002 (DE) ......................... 102 30 510

(51) Int. Cl.$^7$ ............................. G01R 33/06
(52) U.S. Cl. ....................... 324/207.19; 324/207.25; 324/260
(58) Field of Search .......... 324/207.19, 207.21–207.22, 324/207.25, 234–235, 207.2, 244, 251, 260; 73/DIG. 2–DIG. 3

(56) References Cited

FOREIGN PATENT DOCUMENTS

DE          10158053 A       6/2003

*Primary Examiner*—Bot LeDynh
(74) *Attorney, Agent, or Firm*—Aaron Waxler

(57) ABSTRACT

What is described is a sensor array with at least two sub-bridges, which are coupled together to form at least one Wheatstone bridge and which are equipped, in each of the sub-bridges, with at least two magnetoresistive sensor elements, wherein the sensor elements are sensitive to the magnetic field strength of an applied magnetic field along a measurement direction, and the sub-bridges are designed to deliver a measurement signal as a function of a field component of the magnetic field, designated a measurement field, measured in the measurement direction, wherein, further, in a first of the sub-bridges at least two of the sensor elements exhibit barber pole structures with differing alignments, in a second of the sub-bridges at least two of the sensor elements are designed without barber pole structures, and the measurement signals of the first sub-bridge at least largely coincide with the measurement signals of the second sub-bridge in a specified range of values around a zero point of the magnetic field strength of the measurement field. A sensor array with a further improved interference immunity against magnetic interference fields is thereby created.

4 Claims, 5 Drawing Sheets

SENSOR ARRAY

The invention relates to a sensor array.

German patent application 101 58 053.3 describes a sensor array with at least two sub-bridges, which are coupled together to form at least one Wheatstone bridge and wherein each of the sub-bridges is equipped with at least two magnetoresistive sensor elements. These sensor elements are sensitive to the magnetic field strength of an applied magnetic field along a measurement direction, and are designed to deliver a measurement signal as a function of a field component of the magnetic field, designated a measurement field, measured in the measurement direction. Herein, at least two of the sensor elements in each of the sub-bridges exhibited barber pole structures with differing alignments. The location coordinates of the sensor elements of at least one of the sub-bridges and the location coordinates of the sensor elements of at least one of the other sub-bridges along a coordinate axis running in the measurement direction are selected to differ from each other to a predetermined degree.

The described sensor array already has a high interference immunity against magnetic interference fields, and enables a reliable operating mode even under onerous operating conditions.

It is an object of the invention to create a sensor array with a further improved interference immunity against magnetic interference fields.

This object is achieved in accordance with the invention by means of a sensor array with at least two sub-bridges, which are coupled together to form at least one Wheatstone bridge and which are equipped, in each of the sub-bridges, with at least two magnetoresistive sensor elements, wherein the sensor elements are sensitive to the magnetic field strength of an applied magnetic field along a measurement direction, and the sub-bridges are designed to deliver a measurement signal as a function of a field component of the magnetic field, designated a measurement field, measured in the measurement direction, wherein, further, in a first of the sub-bridges at least two of the sensor elements exhibit barber pole structures with differing alignments, in a second of the sub-bridges at least two of the sensor elements are designed without barber pole structures, and the measurement signals of the first sub-bridge at least largely coincide with the measurement signals of the second sub-bridge in a specified range of values around a zero point of the magnetic field strength of the measurement field.

The sensor array in accordance with the invention does not just exhibit a further improved interference immunity against magnetic interference fields, but also supplies measurement signals with significantly greater signal amplitudes than the sensor array described in German patent application 101 58 053.3. It also transpires that production tolerances in the manufacture of the sensor array in accordance with the invention influence the dependence of the measurement signal on the measurement field to a much lesser extent than in the case of the sensor array described in German patent application 101 58 053.3.

In accordance with an advantageous development of the invention, location coordinates of the sensor elements of the first sub-bridge and location coordinates of the sensor elements of the second sub-bridge along a coordinate axis running in the measurement direction are selected so that they differ from one another to a predetermined extent. As a result, especially high signal amplitudes can be achieved for the measurement signals.

In a different embodiment of the invention, the measurement field is non-homogeneous at least in the measurement direction. A magnetic field of this kind is also designated as divergent in the measurement direction; its magnetic field lines, which are aligned essentially perpendicular to the measurement direction in the area of the spatial span of the sensor array, also exhibit at least one further directional component in the measurement direction, which additionally varies along the measurement direction. When a magnetic field of this kind is applied to the sub-bridge(s), especially those designed to have sensor elements without a barber pole structure, the operating point of this sub-bridge or the operating points of these sub-bridges are shifted in relation to the working point of the sub-bridge or the working points of the sub-bridges which comprise sensor elements with barber pole structures. This gives rise to a change in the sensitivity of the sub-bridge(s) with sensor elements without barber pole structures as compared with an external homogeneous magnetic field. In particular, the working points of the different sub-bridges are selected in this manner in such a way that the different sub-bridges exhibit matching sensitivities as compared with the said external homogeneous magnetic field.

An especially simple, robust development of the sensor array in accordance with the invention is achieved when the applied magnetic field is generated by an auxiliary magnet designed as a permanent magnet.

The invention will be further described with reference to examples of embodiments shown in the drawings, to which, however, the invention is not restricted.

Magnetoresistive sensor arrays are used in diverse systems for movement sensing, especially of wheels, shafts or similar items coupled with rotating movement-initiating elements, for speed registration on these rotating components. A preferred application area is to be found in vehicle electronics, where they are used primarily for ABS systems, but their use has also been proposed for other application areas, e.g. crankshaft speed sensors. The sensor array with four resistors connected to form a Wheatstone bridge of the type mentioned above is hereby usually operated in front of a toothed wheel made of magnetizable material, wherein the measurement direction, i.e. the magnetically sensitive direction of the sensor array lies parallel with the rotational-direction coordinate of the toothed wheel in the manner described.

The output signal of the Wheatstone bridge can hereby be shown in a first approximation by a sine-wave signal above the movement coordinate of the movement-initiating element, wherein the zero passages in the output signal occur before the center of a tooth or before the center of a gap between every two teeth of the movement-initiating element. When the movement-initiating element is moved, the position of the movement-initiating element as compared with the sensor element can be unambiguously determined from the output signal.

Figure 1:
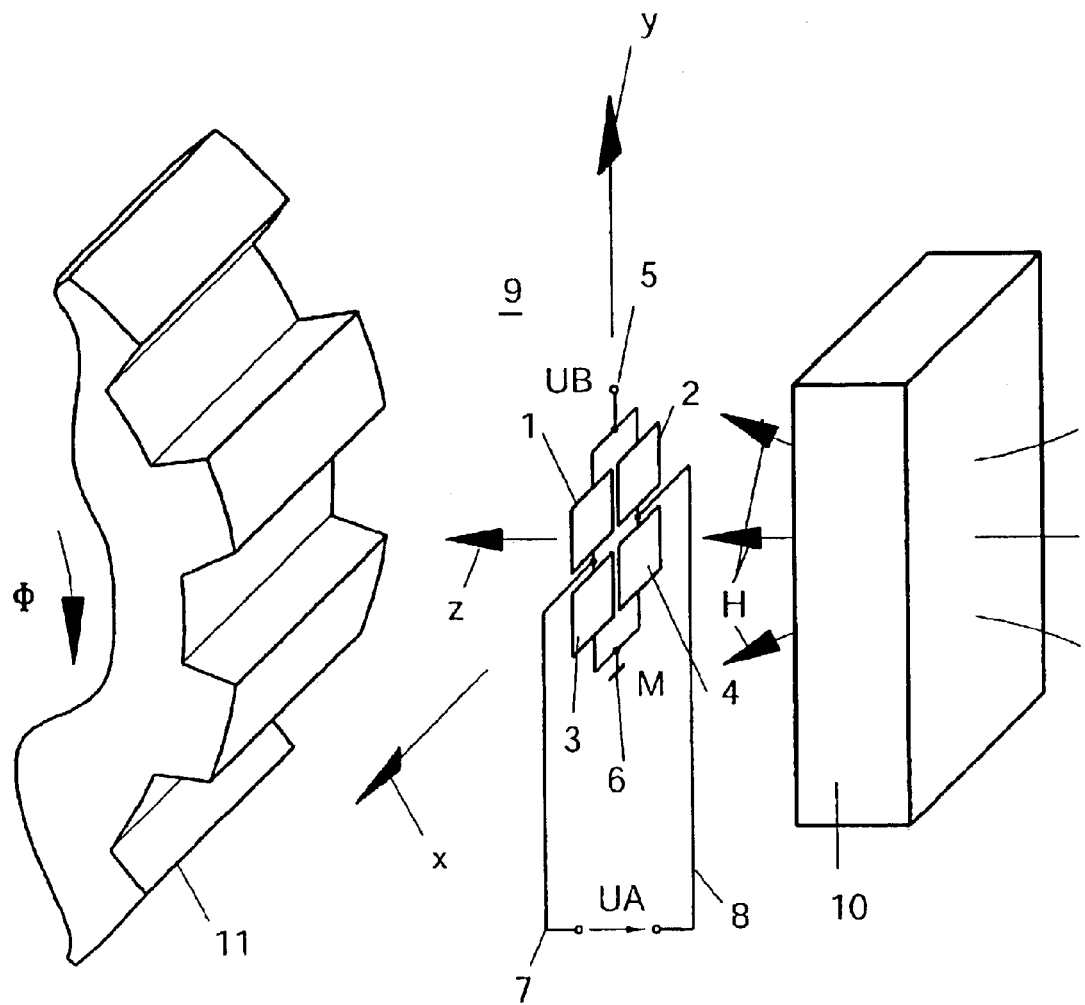
FIG. 1 shows an example of an array for measurement of the rotational speed of a rotating movement-initiating element with a sensor array in accordance with the invention.

An example of an array of this kind for measuring the rotational speed of a rotating movement-initiating element with a sensor array of the type described is shown schematically in FIG. 1. Herein, the magnetoresistive sensor array comprises four sensor elements 1, 2, 3, 4, which exhibit resistance values R1, R2, R3, R4 and are wired as a Wheatstone bridge, wherein a first of these sensor elements identified with reference 1 and a third of these sensor elements identified with reference 3 form a first sub-bridge, whereas a second of these sensor elements identified with reference 2 and a fourth of these sensor elements identified with reference 4 form a second sub-bridge. This Wheatstone bridge is arranged between a first supply-voltage connection 5, to which a first supply-voltage potential UB is applied in operation, and a second supply-voltage connection 6, to which a second supply-voltage potential M, preferably ground potential, is applied in operation. A measurement signal from each of the sub-bridges is tapped off in operation between a first tapping point 7 between the first and the third sensor element 1, 3, and a second tapping point 8 between the second and the fourth sensor element 2, 4; the difference between these measurement signals forms a measurement signal UA of the Wheatstone bridge, which appears between the tapping points 7 and 8. In the example shown, the sensor array is arranged two-dimensionally in a plane enclosed by the x-coordinate axis and the y-coordinate axis of a Cartesian coordinate system, with a z-coordinate axis located perpendicular to this plane. This magnetoresistive sensor array is identified as a whole with reference 9.

Further installed on sensor array 9 is a cuboid permanent magnet, designated working magnet 10 and acting as the auxiliary magnet. In a practical version, this working magnet 10 is preferably bonded onto the rear of sensor array 9 or its housing, so the sensor array 9 is permeated by magnetic field H of working magnet 10. Magnetic field H of working magnet 10 is non-homogeneous; the main direction of the field lines of this magnetic field H runs along the z-coordinate axis, wherein the field lines exhibit further components, at least in the direction of the y-coordinate axis.

The magnetoresistive sensor array 9 exhibits a measurement direction along the y-coordinate axis. Along this measurement direction, it is sensitive to the polarity and the field strength of an external magnetic field and is designed to deliver its measurement signal as a function of a field component of this magnetic field, which is measured in the measurement direction and designated the measurement field. For operation, the external magnetic field should preferably be formed exclusively by magnetic field H of working magnet 10. In practical operation of the sensor array, however, further, unwanted magnetic field components, which are designated interference fields and should, if possible, exert no influence on the measurement signal, superimpose themselves on the external magnetic field formed by magnetic field H of working magnet 10.

To measure the rotational speed of a rotating movement-initiating element with the above-described sensor array 9, a rotating movement-initiating element 11 of this kind is positioned in the direction of the z-coordinate in front of sensor array 9. The movement-initiating element 11 is designed with ferromagnetic material shaped to resemble a toothed wheel, and rotates in operation in the direction of a movement coordinate F. This leads, along movement coordinate F of movement-initiating element 11, to a deformation of the field lines of magnetic field H of working magnet 10 in the measurement direction of sensor array 9 lying in the direction of the y-coordinate axis, occurring periodically with the distance between the teeth of the toothed-wheel shapes of movement-initiating element 11. The field component of magnetic field H in the measurement direction lying in the direction of the y-coordinate axis is hereby designated the measurement field. Through the measurement field, a measurement signal UA, i.e. output signal of the Wheatstone bridge, which is dependent on this movement coordinate F of movement-initiating element 11 and is preferably at least virtually sinusoidal above movement coordinate F, is generated in sensor array 9.

Figure 2:
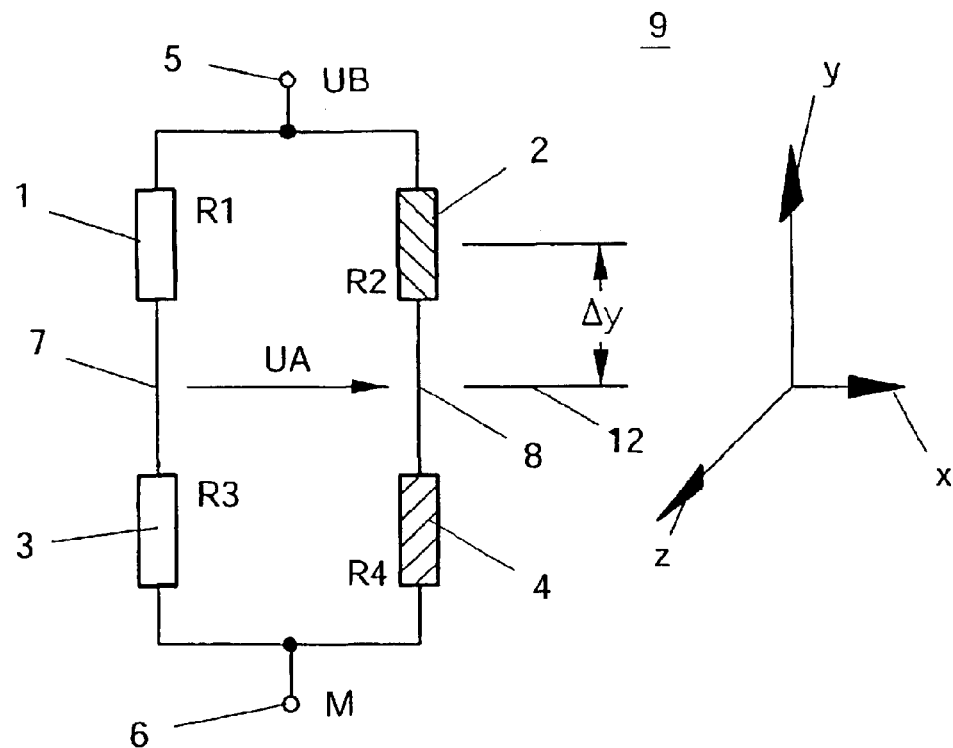
FIG. 2 shows a circuit diagram of a first embodiment of a sensor array in accordance with the invention.

FIG. 2 shows a circuit diagram of a first embodiment of the sensor array 9 in accordance with the invention from FIG. 1, wherein matching elements are again identified with the same reference numbers. It is indicated herein, by different hatching for the second sensor element 2 and the fourth sensor element 4 that these are furnished with barber pole structures, wherein the alignments of the barber pole structures in relation to the flow directions of electrical currents brought about by supply-voltage potential UB and flowing through sensor elements 2 and 4 are indicated by the directions of the hatching. The choice of barber pole structures for sensor elements 2, 4 is, for example, made in such a way that the resistance value R4 of the fourth sensor element 4 increases with a positive value of the magnetic field strength of the measurement field, and the resistance value R2 of the second sensor element 2 reduces with the positive value of the magnetic field strength of the measurement field. To this end, angle ai of the current-flow direction through sensor element i with a vanishing measurement field at the location of sensor element i is selected as follows, with i=2, 4:

$$a2=-45°, a4=+45°.$$

By means of the barber pole structures, the characteristic for the measurement signal of the second sub-bridge from the second and fourth sensor elements 2, 4 is linearized in a manner that is known per se.

The first sensor element 1 and the third sensor element 3 are, conversely, of a design without barber pole structures. The first sub-bridge, which contains them, exhibits a characteristic for the measurement signal delivered by them which shows stronger non-linearities as compared with the characteristic for the measurement signal of the second sub-bridge 2, 4.

For orientation purposes, the Cartesian coordinate system from FIG. 1 is further included in FIG. 2. Also indicated in this regard is a distance Δy from the spatial center of sensor array 9, represented by a center line 12, to the spatial center of a sensor element, here, for example, the second sensor element 2, measured along the y-coordinate axis, i.e. the measurement direction. In sensor array 9 in accordance with FIG. 2, the distances Δy correspond for all four sensor elements 1, 2, 3, 4.

Figure 3:
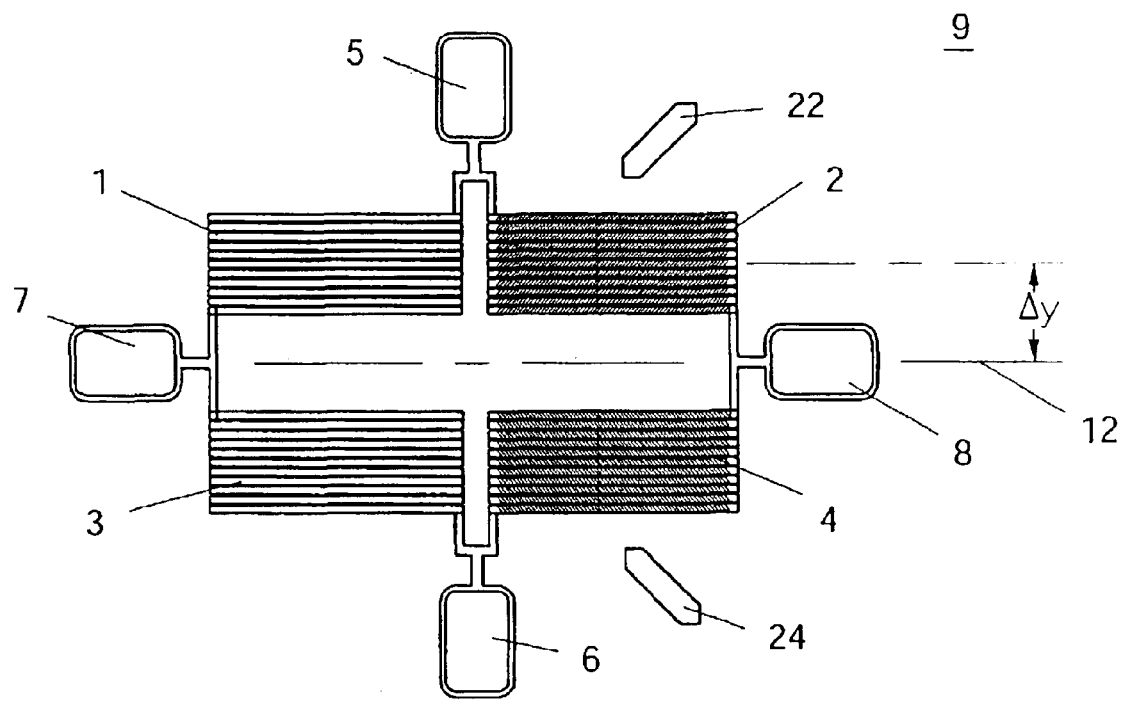
FIG. 3 shows a possible spatial configuration for the sensor array from FIG. 2.

FIG. 3 shows a possible spatial arrangement for the sensor array 9 shown in FIG. 2 in a plan view onto the plane enclosed by the x-coordinate axis and the y-coordinate axis. Each of the sensor elements 1, 2, 3, 4 included in this sensor array 9 is formed by a permalloy strip in meander arrangement on a silicon substrate. In the second and fourth sensor elements 2, 4, the barber pole structures are shown schematically, and, for reasons of clarity, their alignment in the individual sensor elements 2, 4 is shown by symbols 22 and 24 included next to the individual sensor elements 2, 4 respectively. The supply-voltage connections 5, 6 and the tapping points 7, 8 are designed as connection surfaces, e.g. for the connection of bonding wires. The spatial centers of all sensor elements 1, 2, 3, 4 are measured from center line 12 of sensor array 9 with corresponding distances Δy.

Figure 4:
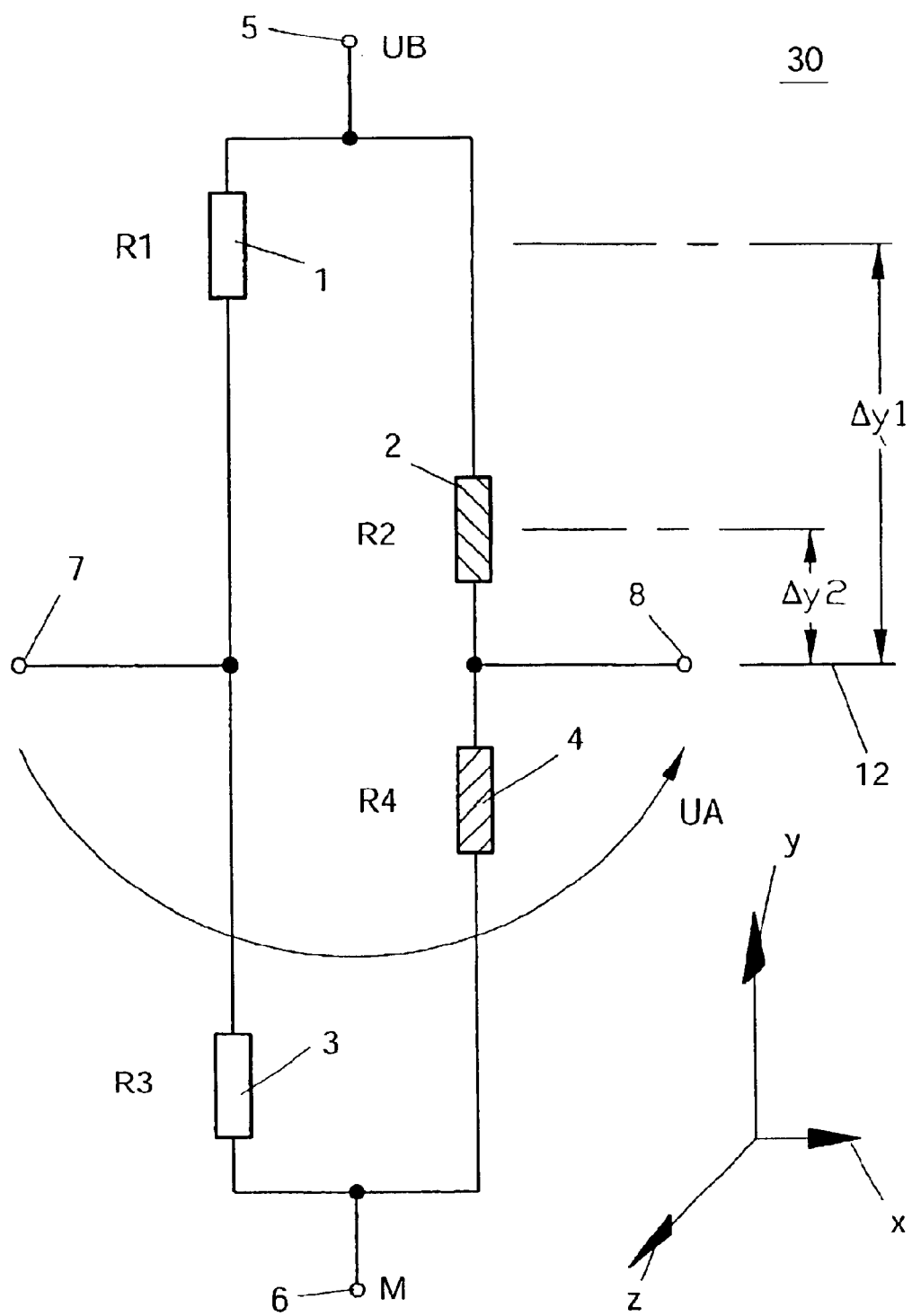
FIG. 4 shows a circuit diagram of a second embodiment of a sensor array in accordance with the invention.

FIG. 4 shows, as a second embodiment of the sensor array in accordance with the invention, a variation of sensor array 9 in accordance with FIG. 1, now designated with reference 30, wherein corresponding elements are again identified with the same reference numbers. Here, the spatial centers of the first and third sensor elements 1, 3 are measured from center line 12 of sensor array 30 with corresponding distances Δy1 and the spatial centers of the second and fourth sensor elements 2, 4 are measured from center line 12 of sensor array 30 with corresponding distances Δy2. Distances Δy1 are selected to be greater than distances Δy2. The measurement signals of sub-bridges 1, 3 and 2, 4, and therefore the measurement signal UA of sensor array 30 exhibit especially high signal amplitudes in comparison with sensor array 9 in the embodiment in accordance with FIG. 2.

Owing to the symmetry of the sensor arrays in accordance with FIGS. 2, 3, and 4 as regards the center axis, it is achieved that the measurement signal UA of the Wheatstone bridge has no offset, and, with a sinusoidal characteristic of the measurement field along movement coordinate F of movement-initiating element 11, exhibits the above-mentioned, similarly sinusoidal characteristic, whose zero passage occurs at "center tooth" and at "center tooth gap" of movement-initiating element 11, i.e. when the center line 12 of sensor array 9 or 30 is located precisely opposite the center of a tooth or a tooth gap in movement-initiating element 11.

Figure 5:
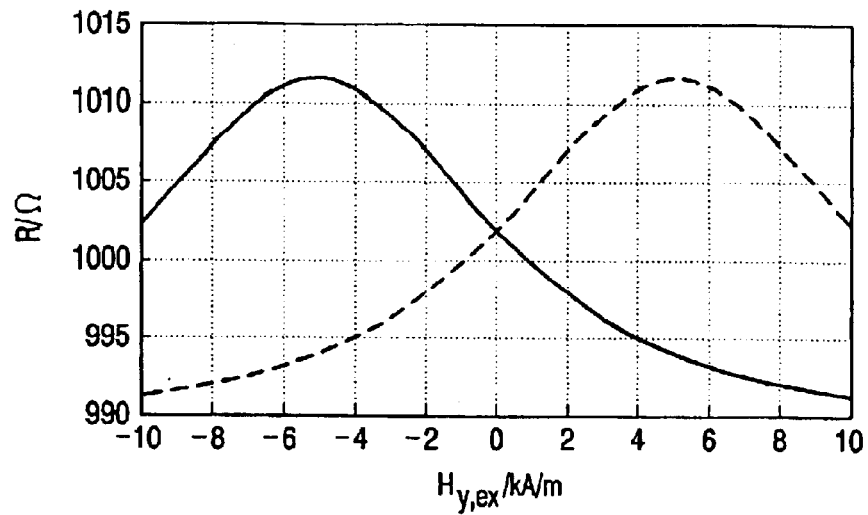
FIG. 5 shows an example of the dependence of the resistance values of sensor elements with barber pole structures on an external, homogeneous interference field with a different spatial position of the sensor elements in a non-homogeneous measurement field.

FIG. 5 shows examples of characteristics of resistance values R1 and R3 of the first and third sensor elements 1 and 3 respectively as functions of the magnetic field strength $H_{y,ex}$ of an external, homogeneous magnetic field superimposed on the magnetic field of working magnet 10, plotted in kA/m. The characteristic of the resistance value R1 is hereby shown with a broken line and the characteristic of resistance value R3 is shown with a solid line. By virtue of the inhomogeneity of the magnetic field of working magnet 10 as described in relation to FIG. 1, especially its divergence in the direction of the y-coordinate axis, i.e. of the measurement direction, the characteristics of resistance values R1 and R3 of the first and third sensor elements 1 and 3 respectively are shifted in relation to each other along the abscissa of the diagram on which the magnetic field strength $H_{y,ex}$ of the external, homogeneous magnetic field is plotted, so that, with a vanishing external magnetic field, resistance value R1 of the first sensor element 1 exhibits a rising characteristic, whereas resistance value R3 of third sensor element 3 exhibits a falling characteristic at this point.

The shifting of the characteristics of resistance values R1 and R3 may be set through selection of the distances Δy and of the characteristic of the field lines of the magnetic field of working magnet 10. The sensitivity of the measurement signal of the first sub-bridge 1, 3 to the magnetic field strength $H_{y,ex}$ of the external, homogeneous magnetic field is thereby adjustable. This sensitivity is preferably set to a value that at least virtually corresponds to the value of the sensitivity of the measurement signal of the second sub-bridge 2, 4 to magnetic field strength $H_{y,ex}$ of the external, homogeneous magnetic field. It is thereby achieved that measurement signal UA from the Wheatstone bridge between tapping points 7 and 8 is at least virtually independent of the external, homogeneous magnetic field. Since magnetic interference fields, i.e. magnetic fields originating elsewhere than from working magnet 10, are generally at least virtually homogeneous over the spatial span of sensor arrays 9 and 30, with this dimensioning, the Wheatstone bridge supplies a measurement signal UA that is at least virtually independent of interference fields of this kind.

The matching of the characteristics of the two sub-bridges may be further influenced by the choice of the internal magnetization constant of sensor elements 1, 2, 3, 4. This is achieved by a variation of the dimensions of the permalloy strip with which sensor elements 1, 2, 3, 4 are constructed, and by variation of the composition of the material. The distances between the sensor elements 1, 2, 3, 4 in the direction of the x-coordinate axis and the direction of magnetization of working magnet 10, as well as its shape if applicable, also exert an influence in this regard.

Figure 6:
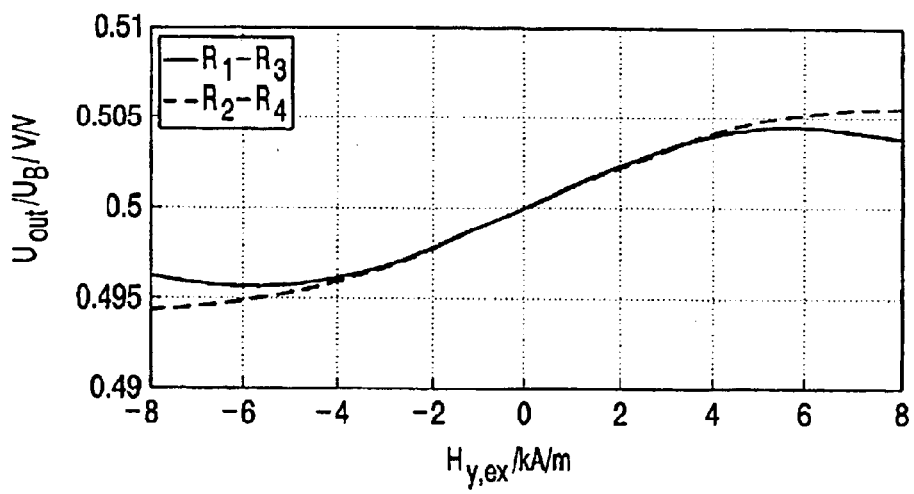
FIG. 6 shows a first example of measurement signals occurring in a sensor array in accordance with the invention.
Figure 6:
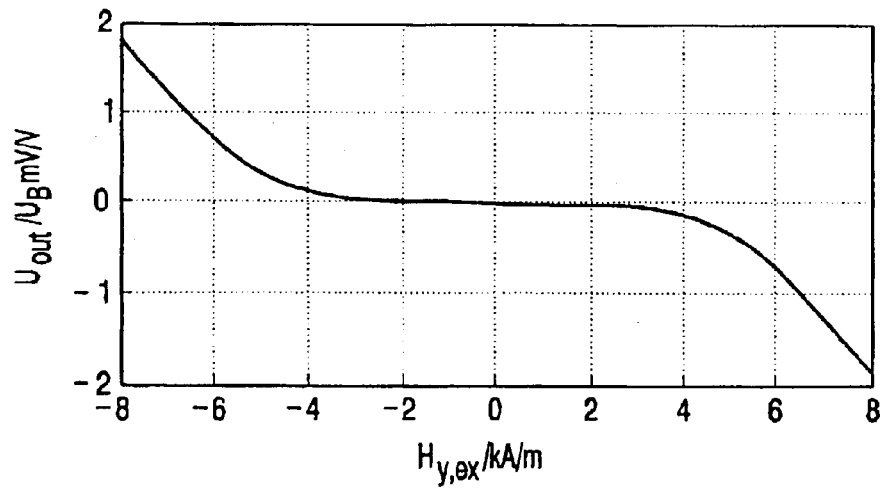

FIG. 6 shows an example of the dependence of the measurement signals occurring in the Wheatstone bridge on the component, measured in the measurement direction, of the magnetic field strength of a homogeneous, magnetic interference field $H_{y,ex}$, which is again plotted along the abscissa in kA/m. The upper of the two diagrams in FIG. 6 shows the measurement signal of the first sub-bridge 1, 3 plotted as $U_{out}/U_B$ in the unit V/V as a characteristic curve designated with $R_1$–$R_3$, drawn with a solid line, and the measurement signal of the second sub-bridge 2, 4 also plotted as $U_{out}/U_B$ in the unit V/V as a characteristic curve designated with $R_2$–$R_4$, is drawn with a broken line. For magnetic field strengths of the interference field in the example shown of up to approximately 3 kA/m in both polarities, the measurement signals of the two sub-bridges correspond virtually completely, so measurement signal UA from the Wheatstone bridge is at least virtually independent of the external, homogeneous magnetic field between the tapping points 7 and 8. Measurement signal UA is plotted as $U_{out}/U_B$ in the unit mV/V in the lower diagram in FIG. 6, and exhibits a virtually horizontal characteristic in the specified area of the component, measured in the measurement direction, of magnetic field strength of the homogeneous, magnetic interference field $H_{y,ex}$. In this area, therefore, a very good suppression of the influence of the magnetic interference field can be guaranteed. In this example, it is only at an amount of more than 3 kA/m for the magnetic field strength of the homogeneous, magnetic interference field $H_{y,ex}$ that the non-linear properties of the first sub-bridge with sensor elements 1, 3 without barber pole structures make themselves felt, so the suppression of the interference field decreases here.

The sensor array in accordance with the invention still operates free from errors, with good interference field suppression of this kind, even under the influence of especially strong magnetic interference fields, as can occur in the area of a combustion engine, e.g. for motor vehicles, especially in the vicinity of components carrying high electrical currents. It may be anticipated that components of this kind will be increasingly used in the future. An example of this is the crankshaft starter generator in planned vehicle electrical systems with supply voltages of up to 42 V.

Figure 7:
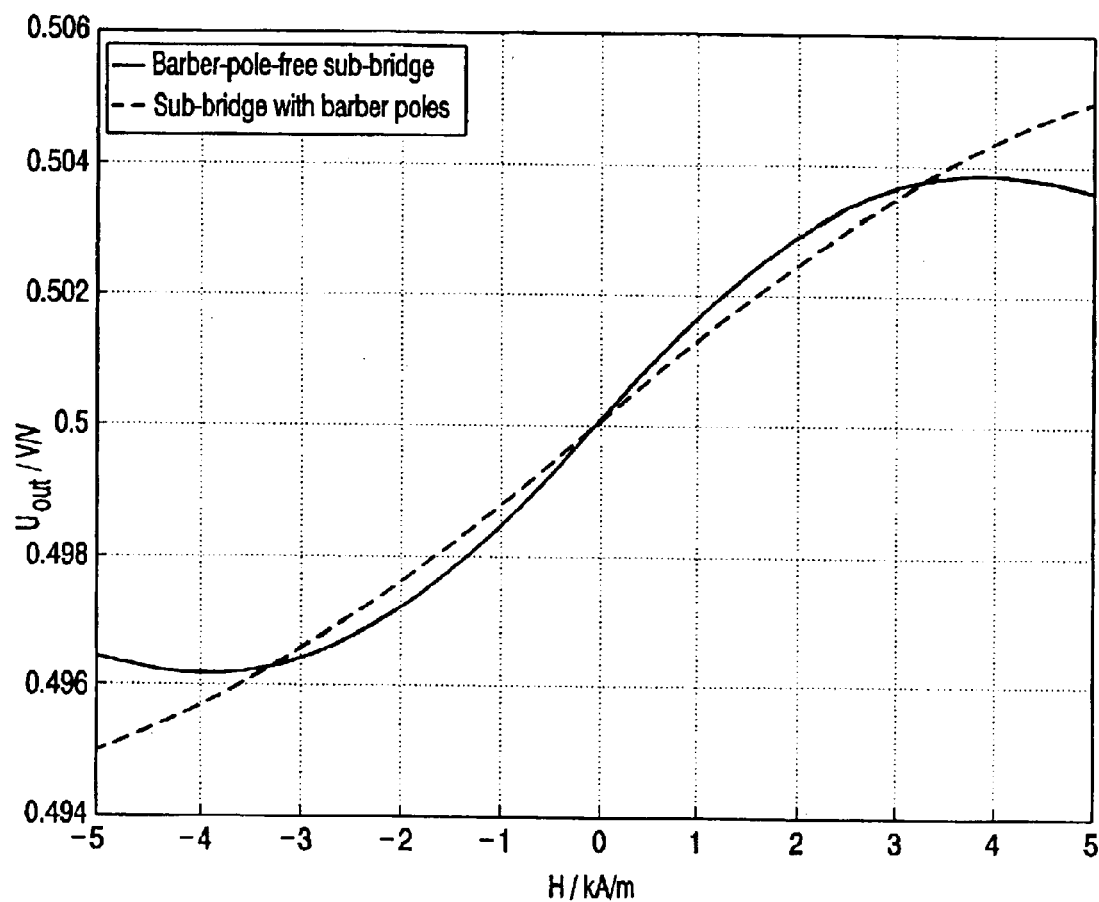
FIG. 7 shows a second example of measurement signals occurring in a sensor array in accordance with the invention.

FIG. 7 shows, in a second example of the measurement signals in a sensor array in accordance with the invention, the measurement signal of the first sub-bridge 1, 3, here designated a "barber pole-free sub-bridge" plotted as $U_{out}$ in the unit V/V as a characteristic curve drawn with a solid line, and the measurement signal of the second sub-bridge 2, 4, here designated a "sub-bridge with barber poles", also plotted as $U_{out}$ in the unit V/V as a characteristic curve drawn with a broken line over the magnetic field strength H of the homogeneous, magnetic interference field plotted on the abscissa in the unit kA/m.

What is claimed is:

1. A sensor array with at least two sub-bridges, which are coupled together to form at least one Wheatstone bridge and which are equipped, in each of the sub-bridges, with at least two magnetoresistive sensor elements, wherein the sensor elements are sensitive to the magnetic field strength of an applied magnetic field along a measurement direction, and the sub-bridges are designed to deliver a measurement signal as a function of a field component of the magnetic field, designated a measurement field, measured in the measurement direction, wherein, further, in a first of the sub-bridges at least two of the sensor elements exhibit barber pole structures with differing alignments, in a second of the sub-bridges at least two of the sensor elements are designed without barber pole structures, and the measurement signals of the first sub-bridge at least largely coincide with the measurement signals of the second sub-bridge in a specified range of values around a zero point of the magnetic field strength of the measurement field.

2. A sensor array as claimed in claim 1, characterized in that the location coordinates of the sensor elements of the first sub-bridge and the location coordinates of the sensor elements of the second sub-bridge along a coordinate axis running in the measurement direction are selected to differ from each other to a predetermined degree.

3. A sensor array as claimed in claim 1, characterized in that the measurement field is non-homogeneous at least in the measurement direction.

4. A sensor array as claimed in claim 1 or 2, characterized in that the applied magnetic field is generated by an auxiliary magnet designed as a permanent magnet.

* * * * *